US 6,991,965 B2

(12) United States Patent
Ono

(10) Patent No.: US 6,991,965 B2
(45) Date of Patent: Jan. 31, 2006

(54) PRODUCTION METHOD FOR MANUFACTURING A PLURALITY OF CHIP-SIZE PACKAGES

(75) Inventor: Yoshihiro Ono, Kawasaki (JP)

(73) Assignee: NEC Electronics Corporation (JP)

(*) Notice: Subject to any disclaimer, the term of this patent is extended or adjusted under 35 U.S.C. 154(b) by 83 days.

(21) Appl. No.: 10/718,848

(22) Filed: Nov. 21, 2003

(65) Prior Publication Data
US 2004/0115868 A1 Jun. 17, 2004

(30) Foreign Application Priority Data
Dec. 13, 2002 (JP) .................... 2002-362646

(51) Int. Cl.
H01L 21/44 (2006.01)

(52) U.S. Cl. .................. 438/114; 438/617; 257/780
(58) Field of Classification Search .......... 257/780; 438/114, 617
See application file for complete search history.

(56) References Cited

U.S. PATENT DOCUMENTS

| 5,977,641 | A | * | 11/1999 | Takahashi et al. | ........... 257/778 |
| 6,046,071 | A | * | 4/2000 | Sawai et al. | .............. 438/106 |
| 6,157,080 | A | * | 12/2000 | Tamaki et al. | ............. 257/738 |
| 6,218,728 | B1 | * | 4/2001 | Kimura | ................. 257/693 |
| 6,268,662 | B1 | * | 7/2001 | Test et al. | ................... 257/784 |
| 6,511,865 | B1 | * | 1/2003 | Lin | ........................... 438/107 |
| 6,586,836 | B1 | * | 7/2003 | Ma et al. | .................... 257/723 |
| 6,590,293 | B2 | * | 7/2003 | Onishi et al. | ............... 257/780 |
| 6,603,191 | B2 | * | 8/2003 | Wakabayashi et al. | ...... 257/620 |
| 2003/0183947 | A1 | * | 10/2003 | Ohuchi | ........................ 257/778 |

FOREIGN PATENT DOCUMENTS

| JP | 50-87278 | 7/1975 |
| JP | 09-064049 | 3/1997 |
| JP | 10-032224 | 2/1998 |
| JP | 10-335528 | 12/1998 |
| JP | 11-135549 | 5/1999 |
| JP | 2000-036509 | 2/2000 |
| JP | 2000-223647 | 8/2000 |
| JP | 2000-306939 | 11/2000 |
| JP | 2001-024085 | 1/2001 |
| JP | 2001-203297 | 7/2001 |
| JP | 2001-250876 | 9/2001 |
| JP | 2002-110854 | 4/2002 |

* cited by examiner

Primary Examiner—Christian Wilson
(74) Attorney, Agent, or Firm—Hayes Soloway P.C.

(57) ABSTRACT

In a production method for manufacturing a plurality of chip-size packages, a plurality of semiconductor chip areas are defined on a surface of a wafer, each of the chip areas being produced as a semiconductor device having a plurality of electrode pads formed thereon. A plurality of sprout-shaped metal bumps formed on each device such that the respective metal bumps are bonded on the pads formed on a corresponding semiconductor device. A resin-sealing layer is formed on the surface of the wafer such that tips of the metal bumps formed on each of the devices are projected from a top surface of the resin-sealing layer. A plurality of wiring patterns are formed on the top surface of the resin-sealing layer such that each of the wiring patterns is allocated to a corresponding semiconductor device, and such that electrical connections are established between each of the wiring patterns and the tips of the metal bumps formed on the corresponding semiconductor device. A plurality of metal balls are formed on each of the wiring patterns such that electrical connections are established therebetween.

17 Claims, 12 Drawing Sheets

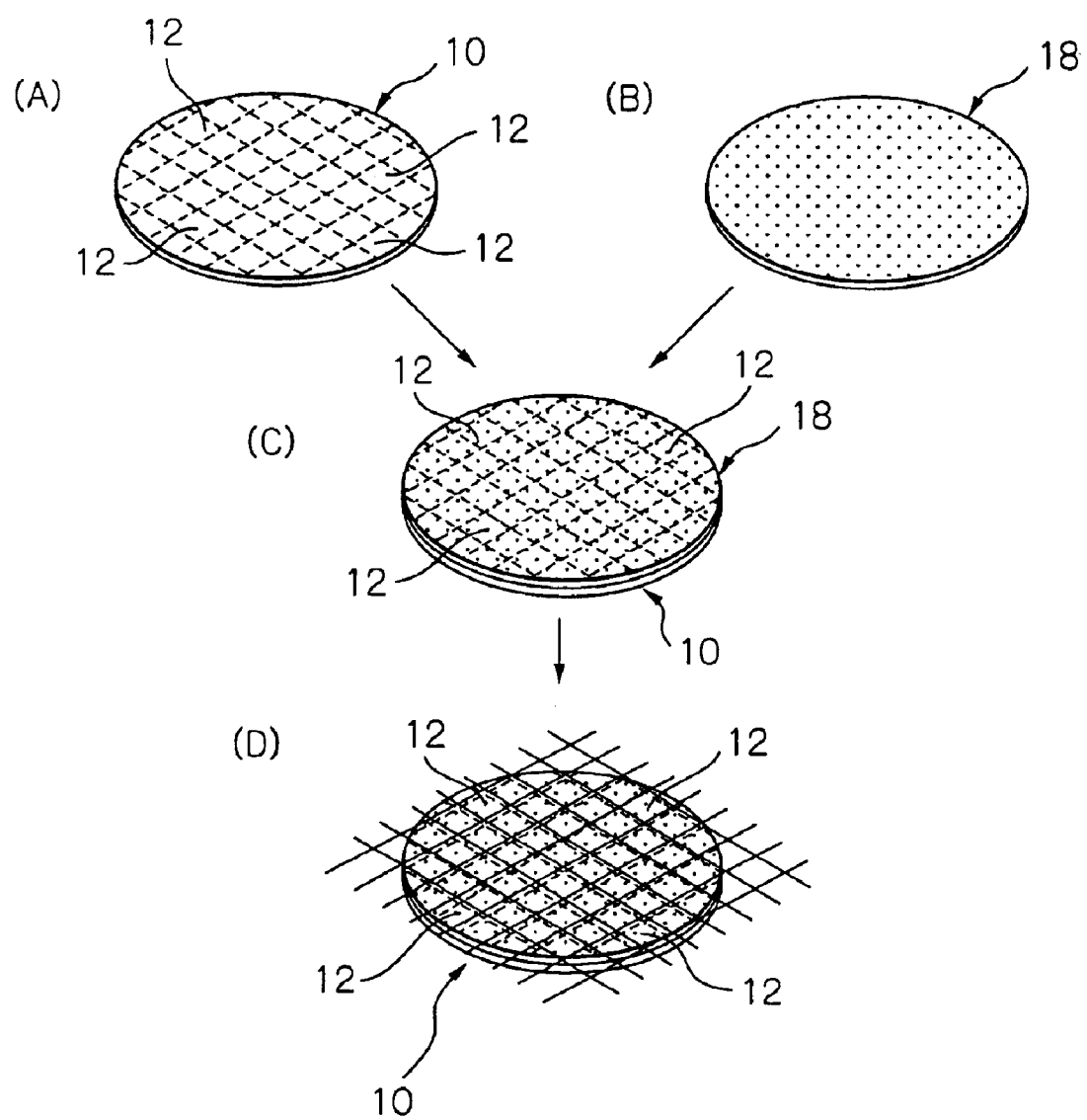

PRODUCTION METHOD FOR MANUFACTURING A PLURALITY OF CHIP-SIZE PACKAGES

BACKGROUND OF THE INVENTION

1. Field of the Invention

The present invention relates to a production method for manufacturing a plurality of chip-size packages, each of which has substantially the same size or extent as a semiconductor device included therein and sealed with a suitable resin material.

2. Description of the Related Art

As well known, a chip-size package (CSP) has been developed so as to meet the demands of higher performance, smaller and lighter size, and higher speed for a piece of electronic equipment. Namely, inherently, there is a demand for more miniaturization, higher performance, and lower production cost of the chip-size package per se.

In a representative conventional production method for manufacturing chip-size packages, for example, a silicon wafer is prepared, and a surface of the silicon wafer is sectioned into a plurality of semiconductor chip areas by forming grid-like fine grooves (i.e. scribe lines) in the silicon wafer. Then, the silicon wafer is processed by various well-known methods such that each of the semiconductor chip areas is produced as a semiconductor device. Subsequently, a plurality of electrode pads are formed and arranged on each of the semiconductor chip areas, and respective metal bumps are bonded on the electrode pads. Namely, each of the semiconductor devices is formed as a flip-chip (FC) type semiconductor device. Thereafter, the silicon wafer is subjected to a dicing process in which the silicon wafer is cut along the grid-like grooves defining the FC type semiconductor devices, so that the FC type semiconductor devices are separated from each other.

On the other hand, in the production of the chip-size packages, a plurality of wiring-boards, each of which is usually called a package board or interposer, are prepared, with each of the interposers having substantially the same size or extent as an FC type semiconductor device. Also, each of the interposers includes a plurality of upper electrode pads formed on an upper surface thereof, a plurality of lower electrode pads formed on a lower surface thereof, a plurality of solder balls bonded on the lower electrode pads formed on the bottom surface of the interposer, and an internal wiring-arrangement provided between the upper and lower surfaces of the interposer to establish electrical connections between the upper and lower electrode pads.

After the aforesaid dicing process, each of the separated FC type semiconductor devices is flipped over and put in place on the upper surface of an interposer such that the respective metal bumps of the FC type semiconductor device are in electrical contact with the upper electrode pads formed on the upper surface of the interposer. Then, the metal bumps of the FC type semiconductor device are securely bonded on the upper electrode pads of the interposer by using either an ultrasonic-pressure bonding method or a heat-pressure bonding method. Subsequently, a resin-underfilling process is carried out such that a space between the FC type semiconductor device and the interposer is filled with a suitable resin material, to thereby seal the arrangement of metal bumps, resulting in the production of the chip-size package.

The above-mentioned conventional production method for manufacturing the chip-size packages is very inefficient in that the separated FC type semiconductor devices must be individually combined with the interposers, and then must be individually sealed with the suitable resin material.

In order to efficiently manufacture a large quantity of chip-size packages, it has been proposed that the chip-size packages be produced in a lump on semiconductor chip areas defined on a silicon wafer, without using any interposers, and that the silicon wafer then be cut so that the chip-size packages are separated from each other, as disclosed in, for example, JP-A-09-064049, JP-A-11-135549, and JP-A-2001-203297.

In particular, similar to the above-mentioned case, a plurality of semiconductor devices are produced on a silicon wafer, a plurality of electrode pads are formed on each of the semiconductor chip areas, and respective metal bumps are bonded on the electrode pads. Then, the surface of the silicon wafer, on which both the electrode pads and the metal bumps are provided, is coated with a suitable uncured resin material to thereby produce a resin-sealing layer, as disclosed in JP-A-09-064049. Otherwise, an adhesive resin-sealing sheet containing an uncured thermosetting resin is applied to and pressed against the surface of the silicon wafer such that the electrode pads the metal bumps are penetrated into the adhesive resin-sealing sheet, to thereby produce a resin-sealing layer, as disclosed in JP-A-2001-203297.

In either case, after the resin-sealing layer is completely cured, it is subjected to a polishing process. Namely, the surface of the resin-sealing layer is polished so that top faces of the metal bumps are exposed to the outside, and a metal layer is formed on the polished surface of the resin-sealing layer.

Subsequently, the metal layer is patterned by using a photolithography process and an etching process so that a plurality of conducting paths are formed on the surface of the resin-sealing layer, with each of the conducting paths being in electrical contact with an exposed top face of a corresponding metal bump. Thereafter, a plurality of solder balls are bonded on the conducting paths, whereby a plurality of chip-size package are produced on the silicon wafer. Then, the silicon wafer is subjected to a dicing process, so that the chip-size packages are cut and separated from each other, resulting in the production of the plurality of chip-size packages in a lump.

According to this second conventional production method, it is possible to more efficiently manufacture the large quantity of chip-size packages in comparison with the aforesaid first conventional production method in that the plurality of chip-size packages are produced in a lump on the silicon wafer. Nevertheless, there is a room for further improvement of the second conventional production method.

In particular, as stated above, the second conventional production method involves the polishing process, but this polishing process is relatively troublesome because the residue produced in the polishing process must be rinsed off from the polished silicon wafer.

SUMMARY OF THE INVENTION

Therefore, an object of the present invention is to provide a production method for further efficiently manufacturing a plurality of chip-size packages, each of which has substantially the same size or extent as a semiconductor device included therein and sealed with a suitable resin material.

In accordance with a first aspect of the present invention, there is provided a production method that manufactures a plurality of chip-size packages, which comprises the steps of: defining a plurality of semiconductor chip areas on a surface of a wafer, with each of the semiconductor chip areas being produced as a semiconductor device having a plurality of electrode pads formed thereon; forming a plurality of sprout-shaped metal bumps on each of the semiconductor devices such that the respective sprout-shaped metal bumps are bonded on the electrode pads formed on a corresponding semiconductor device; forming a resin-sealing layer on the surface of the wafer such that tips of the sprout-shaped metal bumps formed on each of the semiconductor devices are projected from a top surface of the resin-sealing layer; forming a plurality of wiring patterns on the top surface of the resin-sealing layer such that each of the wiring patterns is allocated to a corresponding semiconductor device, and such that electrical connections are established between each of the wiring patterns and the tips of the sprout-shaped metal bumps formed on the corresponding semiconductor device; and forming a plurality of outer electrode terminals on each of the wiring patterns such that electrical connections are established therebetween, whereby each of the semiconductor devices is produced as a resin-sealed chip-size package on the wafer.

This wafer carrying the resin-sealed chip-size packages produced thereon may be commercially distributed and circulated in an electronic market to manufacture various electronic products. Of course, the production method may further comprise dicing the wafer such that the resin-sealed chip-size packages are individually separated therefrom, if necessary.

Each of the wiring patterns may include a plurality of conducting paths, and each of the outer electrode terminals may be configured as a metal ball, with the metal ball being soldered and bonded on one of the conducting paths. Preferably, a solder resist layer is formed on the top surface of the resin-sealing layer after the forming of the metal balls, and is patterned such that a plurality of openings are formed to solder and bond the respective metal balls to the conducting paths though the openings formed in the solder resist layer.

In the step of forming the sprout-shaped metal bumps, each of the sprout-shaped metal bumps may be produced from a metal wire, such as gold wire, copper wire or the like, using a wire-bonding machine. In particular, each of the sprout-shaped metal bumps may be defined as a metal bump having a base portion bonded on a corresponding electrode pad, and a cone-like portion integrally protruded from the base portion. The production of each of the sprout-shaped metal bumps may be carried out by stacking up at least two metal bumps, obtained from the metal wire, using the wire-bonding machine, if necessary.

The step of forming the resin-sealing layer may comprise the steps of: preparing an adhesive resin sheet including a film-like support element carrying the sealing-resin layer formed thereon; laminating the adhesive resin sheet on the wafer such that the sprout-shaped metal bumps are penetrated into the resin-sealing layer of the adhesive resin sheet; and removing the film-like support element from the adhesive resin sheet. A thickness of the resin-sealing layer is smaller than an entire height of the sprout-shaped metal bumps, resulting in the projection of the tips of the sprout-shaped metal bumps from the top surface of the resin-sealing layer.

In this case, the step of forming the wiring patterns may comprise: forming of a thin metal film on the top surface of the resin-sealing layer; patterning the thin metal film such that a plurality of film-like metal patterns corresponding to the wiring patterns are formed therein; and thickening the thin metal film patterns such that the film-like metal patterns grow into the wiring patterns. The step of forming the thin metal film may be carried out by using a thin metal film formation process selected from the group consisting a sputtering process, an electroless plating process, and a vacuum metal deposition process, and the step of thickening the thin metal film patterns may be carried out by using an electroplating process.

On the other hand, the step of forming the resin-sealing layer may comprise: preparing an adhesive resin sheet including a film-like metal support element carrying the sealing-resin layer formed thereon; and laminating the adhesive resin sheet on the wafer such that the sprout-shaped metal bumps are penetrated into the resin-sealing layer of the adhesive resin sheet, with a thickness of the resin-sealing layer being smaller than an entire height of the sprout-shaped metal bumps, resulting in the projection of the tips of the sprout-shaped metal bumps from the top surface of the resin-sealing layer, whereby the tips of the sprout-shaped metal bumps are in electrical contact with the film-like metal support element.

In this case, the step of forming of the wiring patterns may comprise: patterning the film-like metal support element such that a plurality of film-like metal patterns corresponding to the wiring patterns are formed therein; and thickening the film-like metal patterns such that the film-like metal patterns grow into the wiring patterns.

BRIEF DESCRIPTION OF THE DRAWINGS

The above objects and other objects will be more clearly understood from the description set forth below, with reference to the accompanying drawings, wherein:

FIG. 1 is an explanatory perspective flow view showing four conceptually representative stages (A), (B), (C), and (D) of a first embodiment of a production method for manufacturing a plurality of chip-size packages from a silicon wafer according to the present invention;

DESCRIPTION OF THE PREFERRED EMBODIMENTS

With reference to FIGS. 1, and 2A to 2L, a first embodiment of a production method for manufacturing a plurality of chip-size packages according to the present invention is shown.

As shown in FIG. 1, the production method features representative four stages, indicated by references (A), (B), (C), and (D), respectively.

At the first stage (A) shown in FIG. 1, a silicon wafer 10 is prepared, and a surface of the silicon wafer 10 is sectioned into a plurality of semiconductor chip areas 12 by forming grid-like fine grooves (i.e. scribe lines) in the silicon wafer 10, with each of the grid-like fine grooves being represented by a broken line in FIG. 1. Namely, the semiconductor chip areas 12 are defined by the grid-like fine grooves. Note, in the FIGS. 2A to 2K, some of the grid-like fine grooves or scribe lines are indicated by references SL.

Figure 2A:
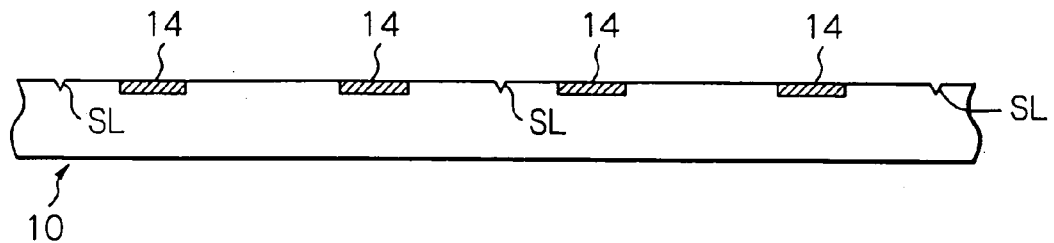
FIGS. 2A and 2B are respective partial cross-sectional views of a silicon wafer, which show representative steps of the first embodiment of the manufacturing method according to the present invention.

The silicon wafer 10 is processed by various well-known methods such that each of the semiconductor chip areas 12 is produced as a semiconductor device. Although not shown in FIG. 1, each of the semiconductor chip areas or semiconductor devices 12 has a plurality of electrode pads 14 formed and arranged thereon, as shown in FIG. 2A by way of example. The formation of the electrode pads 14 is carried out by using a photolithography process and an etching process. Note, each of the electrode pads 14 may be made of a suitable metal material, such as aluminum, copper or the like.

Figure 2B:
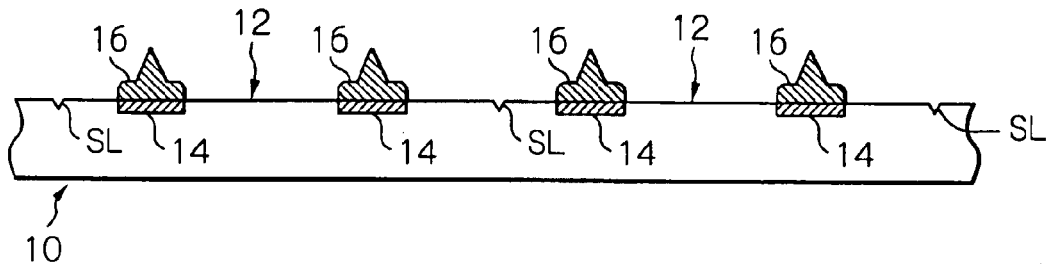

As shown in FIG. 2B, respective metal bumps 16 are bonded on the electrode pads 14. Although each of the metal bumps 16 may be made of a suitable metal material, such as gold, copper or the like, in this embodiment, it is formed as a gold metal bump.

According to the present invention, each of the metal bumps 16 is configured as a sprout-shaped metal bump including a base portion, and a cone-like portion integrally protruded from the base portion, as is apparent from FIG. 2B. For example, it is possible to obtain the sprout-shaped metal bumps 16 by utilizing a well known wire-bonding machine.

In particular, the wire-bonding machine includes a movable capillary tube, through which a fine gold wire passes. A leading or free end of the gold wire, which is protruded from a tip of the capillary tube, terminates at a fine small bead, by which a withdrawal of the gold wire into the capillary tube is prevented. Also, the capillary tube is provided with a needle-like electrode, which is called a torch, and the needle-like electrode is placed beside the tip of the capillary tube.

For the formation of a sprout-shaped metal bump 16, the movable capillary tube is moved such that the small bead is pressed against an electrode pad 14 while being subjected to ultrasonic vibration, and the small bead is welded and bonded on the electrode pad 14 concerned, due to both the ultrasonic vibration and the pressure. Then, while the capillary tube is moved upward so as to draw the gold wire out of the capillary tube, a high voltage is applied to the needle-like electrode to produce a spark between the drawn gold wire and the needle-like electrode.

Thus, the fine gold wire is cut off by the spark, resulting in formation of a sprout-shaped metal bump 16. Namely, the bonded small bead is left as the sprout-shaped metal bump 16 on the electrode pad 14 concerned. On the other hand, the cut-off end of the gold wire is fused due to the spark to thereby produce a fine small bead which is used for a next formation of a sprout-shaped bump 16.

Note, it is possible to optionally determine sizes of the sprout-shaped metal bump 16 by, for example, selecting a thickness of the gold wire, regulating an mount of additives to the gold wire, and controlling the upward movement of the capillary tube.

Preferably, each of the sprout-shaped bumps 16 has an entire height of more than 50 $\mu$m. For example, when the gold wire has a diameter of 25 $\mu$m, it is possible to obtain the sprout-shaped bump 16 having the entire height of more than 50 $\mu$m, with a diameter of the base portion of the sprout-shaped metal bump 16 being approximately 60 $\mu$m. In all cases, it is possible to make the entire heights of all the sprout-shaped metal bumps 16 substantially uniform, by properly controlling the operation of the wire-bonding machine.

Figure 2C:
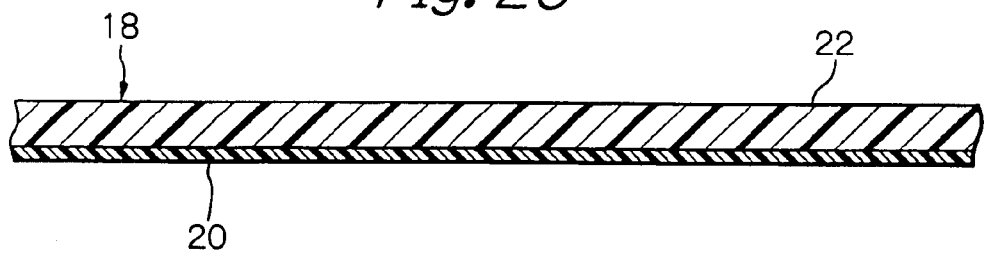
FIG. 2C is a partial cross-sectional view of an adhesive resin sheet prepared at the stage (B) shown in FIG. 1, showing another representative step of the first embodiment of the production method according to the present invention.

On the other hand, at the second stage (B) shown in FIG. 1, an adhesive resin sheet 18, having substantially the same diameter as the silicon wafer 10, is prepared. As shown in FIG. 2C, the adhesive resin sheet 18 is constituted from a film-like support element 20, and a resin-sealing layer 22 formed on the film-like support element 20 and having a thickness less than the entire height of the sprout-shaped metal bumps 16.

For example, the film-like support element 20 may be made of a suitable resin material, such as polyethylene terephthalate (PET) or the like, and the resin-sealing layer 22 may be composed of either a thermoplastic resin material, such as polyimide, or a thermosetting resin material, such as epoxy. The adhesive resin sheet 18 may be produced by coating a surface of the film-like support element 20 with a solution which is composed of a suitable resin component and a suitable solvent component.

After the production of the adhesive resin sheet 18, it is subjected to an evaporation process in which the solvent component is partially evaporated from the resin-sealing layer 22 such that the resin-sealing layer 22 is put in a moderate gel state.

Figure 2D:
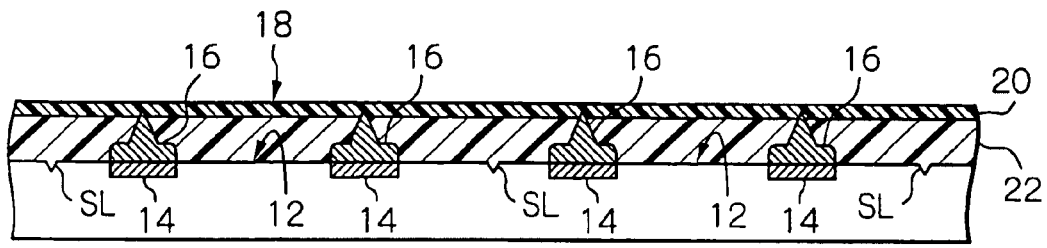
FIGS. 2D to 2k are respective partial cross-sectional views of the silicon wafer, which show other representative steps of the first embodiment of the production method according to the present invention.

At the third stage (C) shown in FIG. 1, the adhesive resin sheet 18 is placed on the silicon wafer 10 such that the surface of the resin-sealing layer 22 is opposed to the arrangement of sprout-shaped metal bumps 16 on the silicon wafer 10. Then, the silicon wafer 10 carrying the adhesive resin sheet 18 placed thereon is subjected to a laminating process by a vacuum laminating machine, a high-pressure press machine, a vacuum press machine and so on, which are well known in this field. Thus, the adhesive resin sheet 18 is pressed against the silicon wafer 10 such that the sprout-shaped metal bumps 16 are penetrated into the adhesive resin sheet 18 due to the moderate gel state of the resin-sealing layer 22, as shown in FIG. 2D.

After the laminating process is completed, the silicon wafer 10 having the laminated adhesive resin sheet 18 is taken out of the vacuum laminating machine. When the resin-sealing layer 22 is composed of the thermoplastic resin material, the silicon wafer 10 having the laminated adhesive resin sheet 18 is left in the ambient temperature so that the adhesive resin layer 32 is solidified. On the other hand, when the resin-sealing layer 22 is composed of the thermosetting resin material, the silicon wafer 10 having the laminated adhesive resin sheet 18 is heated so that the resin-sealing layer 22 is solidified.

The resin-sealing layer 22 of the adhesive resin sheet 18 may exhibit a hardness so that it is difficult or impossible to penetrate the sprout-shaped metal bumps 16 into the adhesive resin sheet 18. In this case, it is necessary to heat and soften the resin-sealing layer 22 so that the sprout-shaped metal bumps 16 can be penetrated into the adhesive resin sheet 18 during the laminating process. Note, when the resin-sealing layer 22 is composed of the thermosetting resin material, it is once softened at a temperature lower than a setting temperature of the thermosetting resin material.

Furthermore, the resin-sealing layer 22 may comprise a hybrid resin material which is composed of a suitable thermoplastic resin component, such as polyimide or the like, and a suitable thermosetting resin component, such as epoxy or the like. Of course, in this case, during the laminating process, it is necessary to put the hybrid-resin-sealing layer in either a moderate gel state or a suitably-softened state such that the sprout-shaped metal bumps 16 can be penetrated into the adhesive resin sheet 18.

Figure 2E:
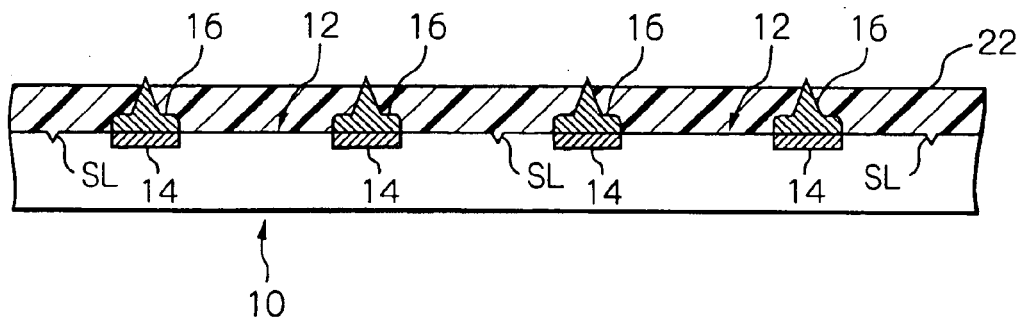

After the resin-sealing layer 22 of the laminated adhesive resin sheet 18 is sufficiently solidified, the film-like support element 20 is peeled and removed from the resin-sealing layer 22 such that the resin-sealing layer 22 is left on the surface of the silicon wafer 10 on which the sprout-shaped metal bumps 16 are arranged, as shown in FIG. 2E. In other words, the resin-sealing layer 22 is transferred from the adhesive resin sheet 18 to the surface of the silicon wafer 10.

As stated above, since the resin-sealing layer 22 has a thickness less than the entire height of the sprout-shaped metal bumps 16, the tip ends of the sprout-shaped metal bumps 16 are projected from the top surface of the resin-sealing layer 22 so as to be exposed to the outside, as is apparent from FIG. 2E.

Figure 2F:
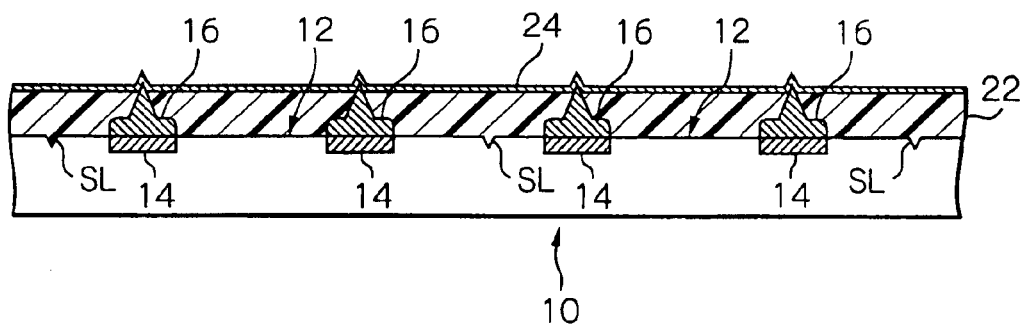

After the removal of the film-like support element 20 from the resin-sealing layer 22, a thin metal film 24 is formed on the top surface of the resin-sealing layer 22 by using a suitable thin metal film formation process, such as a sputtering process, an electroless plating process, a vacuum metal deposition process or the like, as shown in FIG. 2F. Of course, the thin metal film 24 is connected to the tips of the sprout-shaped metal bumps 16 projected from the top surface of the resin-sealing layer 22. Note, the thin metal film 24 may be made of a suitable metal, copper, aluminum or the like.

Figure 2G:
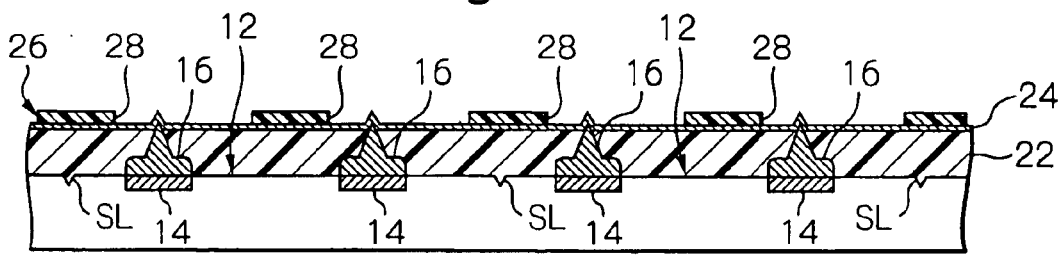

Then, a photoresist layer 26 is formed on the thin metal film 24, and is patterned by using a photolithography process and an etching process such that a plurality of openings 28 are formed in the photoresist layer 26, as shown in FIG. 2G. Namely, the formation of the openings 28 is carried out such that each of the openings 28 exposes a local area of the thin metal film 24 in which a tip end of the sprout-shaped metal bumps 16 is encompassed.

Figure 2H:
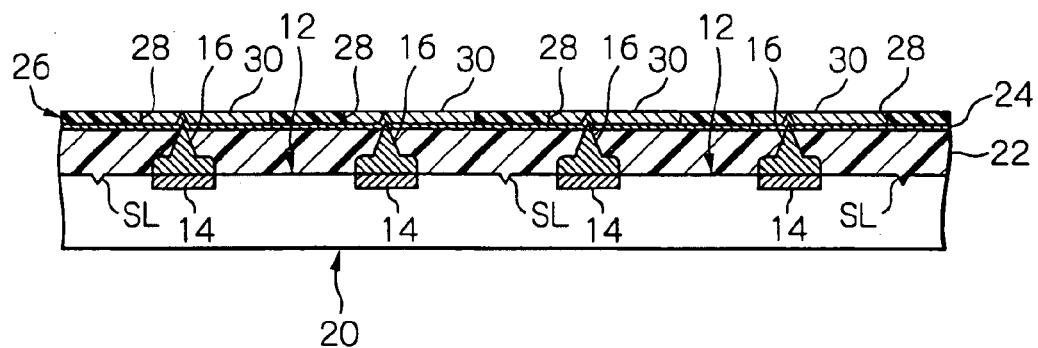
Figure 2I:
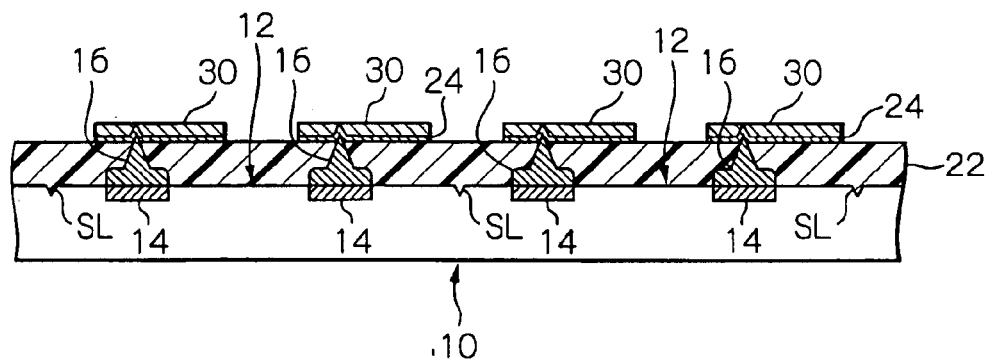

After the formation of the openings 28 in the photoresist layer 26, the silicon wafer 10 is subjected to an electroplating process such that respective conducting paths 30 are formed on the local areas of the thin metal film 24, which are defined by the openings 28, as shown in FIG. 2H. Namely, the patterned photoresist layer 26 having the openings 28 formed therein serves as a plating-resist layer. Then, the patterned plating-resist layer 26 is removed from the thin metal film 24. Then, the portions of the thin metal films 24, which are covered with the patterned plating-resist layer, are further removed from the resin-sealing layer 22 by using, for example, a flash-etching process, as shown in FIG. 2I. In short, the conducting paths 30 define a plurality of wiring patterns formed on the top surface of the resin-sealing layer 22 such that each of the wiring patterns is allocated to a corresponding semiconductor device 12 formed on the silicon wafer 10.

Note, since each of the remaining portions of the thin metal film 24, which are covered by the respective conducting paths 30, is integrated with a corresponding conducting path 30, both the conducting path and the remaining portion are illustrated as an integrated element in further drawings referred to later, and the integrated element is referred to as a conducting path 30 hereinafter.

As is apparent from the above description, in this first embodiment, although the wiring pattern including the conducting paths 30 is produced by using a semi-additive process, another process, such as a subtractive process, a screen printing process and so on may be utilized for the production of the wiring pattern.

Figure 2J:
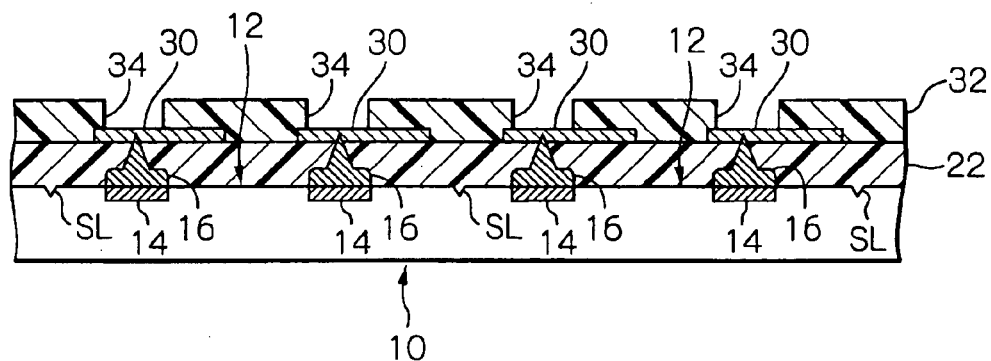

Thereafter, a solder-resist layer 32 is formed on the surface of the resin-sealing layer 22 on which the conducting paths 30 are arranged, and is patterned by using a photolithography process and an etching process such that a plurality of openings 34 are formed in the solder-resist layer 32, as shown in FIG. 2J. Namely, the formation of the openings 34 is carried out such that each of the openings 34 exposes a local area of a corresponding conducting path 30. Note, the solder-resist layer 32 may be composed of a suitable resin material, such as epoxy, polyimide or the like.

Figure 2K:
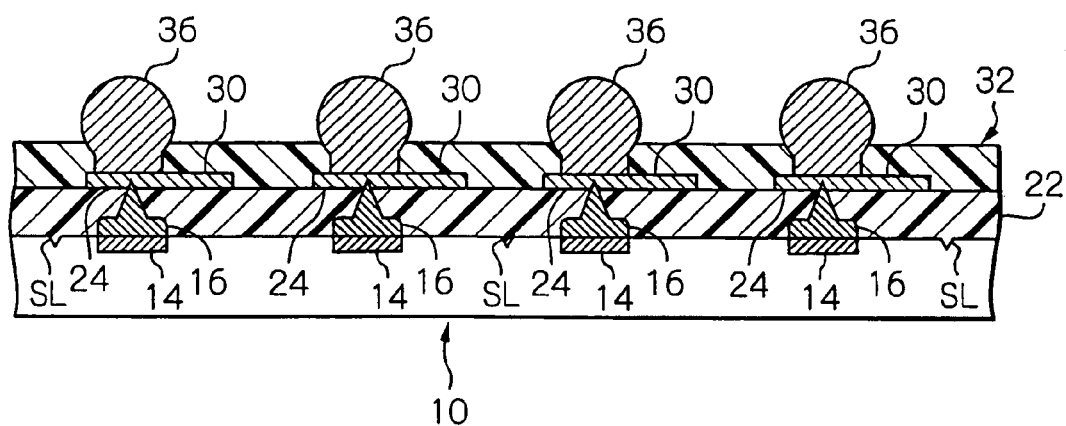

Subsequently, a suitable amount of flux is applied to each of the local areas of the conducting paths 30 defined by the openings 34, and then a plurality of metal balls 36 are soldered and bonded on the conducting paths 30, as shown in FIG. 2K. Note, the metal balls may be made of a suitable metal material, such as solder, tin, silver, copper or the like.

Thus, each of the semiconductor chip areas or semiconductor devices 12 is produced as a resin-sealed chip-size package (CSP) on the silicon wafer 10.

In this resin-sealed chip-size package, the sprout-shaped metal bumps 16, the resin-sealing layer 22 and the conducting paths 30 define a single wiring-arrangement including a plurality of wiring-board sections, each of which is allocated to a corresponding semiconductor device 12 formed on the silicon wafer 10. In other words, each of the wiring-board sections serves as a package board or interposer for a corresponding resin-sealed chip-size package (CSP), with each of the sprout-shaped metal bumps 16 functioning as a through hole or via hole such that an electrical connection is established between a corresponding electrode pad 14 and a corresponding conducting path 30.

Thereafter, the silicon wafer 10 is subjected to a dicing process in which the silicon wafer 10 is cut along the grid-like grooves SL to thereby separate the resin-sealed chip-size packages from each other, as conceptually illustrated in the fourth stage (D) of FIG. 1.

Figure 2L:
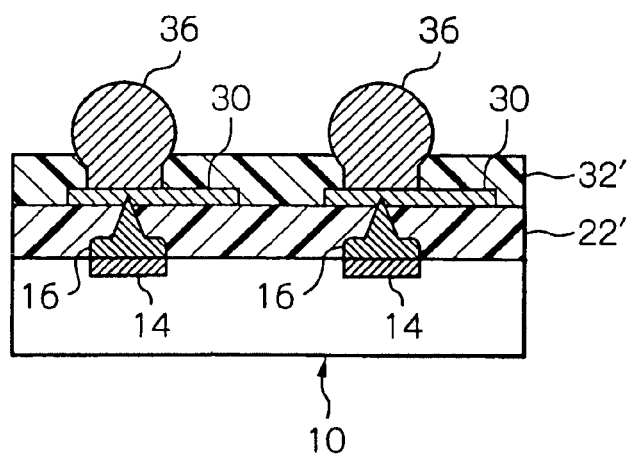
FIG. 2L is a partial cross-sectional view of a representative of the resin-sealed chip-size packages produced in accordance with the first embodiment of the production method according to the present invention.

With reference to FIG. 2L, one of the separated resin-sealed chip-size packages is representatively illustrated. As is apparent from this drawing, the wiring-board section including both the separated section 22' of the resin-sealing layer 22 and the separated section 32' of the solder-resist layer 32 has substantially the same size or extent as the semiconductor device 12 cut and separated from the silicon wafer.

Note, although only the two metal balls 36 are conceptually illustrated by way of example in the cross-sectional view of FIG. 2L, in reality, a plurality of metal balls are arranged on the wiring pattern including the conducting paths 30.

Of course, the resin-sealed chip-size package is mounted on a plurality of electrode pads formed on a motherboard, such that the respective metal balls 16 of the chip-size package are in contact with the electrode pads of the motherboard, and thus the metal balls 16 must be arranged such that the arrangement of the metal balls 16 coincides with an arrangement of the electrode pads on the motherboard.

When it is difficult or impossible to directly obtain the coincidence between the arrangement of the metal balls 16 and the arrangement of the electrode pads on the motherboard by the aforesaid first wiring-arrangement defined by the sprout-shaped metal bumps 16, the resin-sealing layer 22, and the conducting paths 30, a second wiring-arrangement is further formed on the first wiring-arrangement such that the arrangement of the metal balls can be easily coincided with the arrangement of the electrode pads on the motherboard.

FIGS. 3A to 3G show a modification of the aforesaid first embodiment, in which the aforesaid second wiring-arrangement is formed on the aforesaid first wiring-arrangement. Note, in FIGS. 3A to 3G, the features similar to those of FIGS. 2A to 2L are indicated by the same references.

Figure 3A:
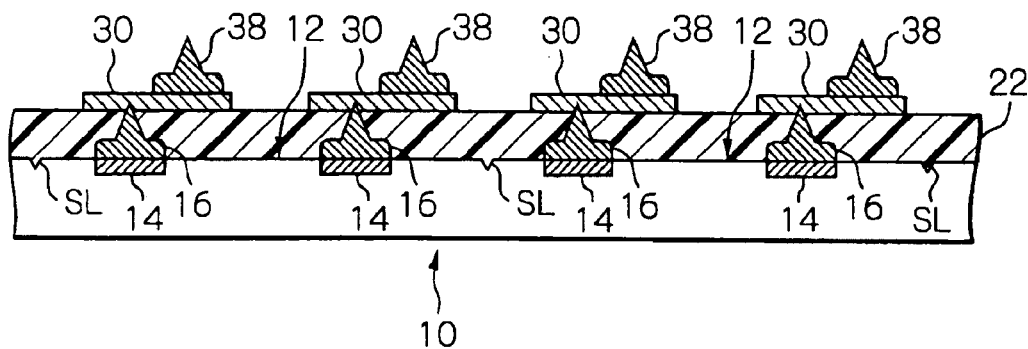
FIGS. 3A to 3F are respective partial cross-sectional views of the silicon wafer, showing a first modification of the first embodiment of the production method according to the present invention.

In particular, first, as shown in FIG. 3A, respective second metal bumps 38 are bonded on the conducting paths 30 of the first wiring-arrangement on the silicon wafer 10 obtained at the step of FIG. 2I. Similar to the aforesaid first metal bumps 16, although each of the second metal bumps 38 is made of gold, it may be made of another suitable metal material, such as copper or the like, and it is possible to produce the metal bumps 38, using the aforesaid wire-bonding machine. Note, in this embodiment, each of the second metal bumps 38 has substantially the same size as the first metal bumps 16.

Then, a second adhesive resin sheet 40 is prepared, and is then laminated on the aforesaid first wiring-arrangement in substantially the same manner as mentioned above, as shown in FIG. 3B. Similar to the aforesaid first adhesive resin sheet 18, the second adhesive resin sheet 40 is constituted from a film-like support element 42, and a resin-sealing layer 44 formed on the film-like support element 42. The film-like support element 42 may be made of a suitable resin material, such as polyethylene terephthalate (PET) or the like, and the resin-sealing layer 44 may be composed of either a thermoplastic resin material, such as polyimide, or a thermosetting resin material, such as epoxy. Furthermore, the resin-sealing layer 44 may comprise a hybrid resin material which is composed of a suitable thermoplastic resin component, such as polyimide or the like, and a suitable thermosetting resin component, such as epoxy or the like. In short, the first and second adhesive resin sheets 18 and 40 are substantially identical to each other.

Figure 3B:
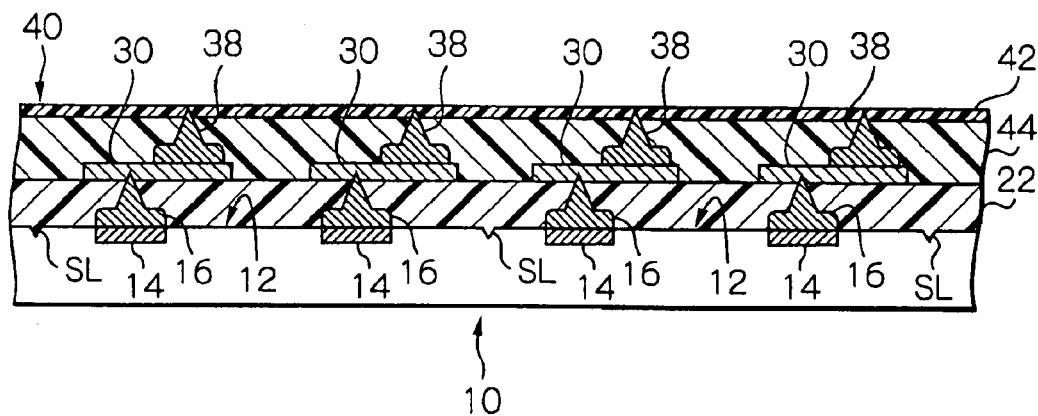

As is apparent from FIG. 3B, the resin-sealing layer 44 of the second adhesive resin layer 40 have a thickness less than a total dimension of the thickness of the conducting paths 30 plus the entire height of the second sprout-shaped metal bumps 38. Thus, the second sprout-shaped metal bumps 38 are penetrated through the adhesive resin layer 40 of the second adhesive resin sheet 40 when the second adhesive resin sheet 40 is laminated on the aforesaid wiring-arrangement formed on the silicon wafer 10.

Figure 3C:
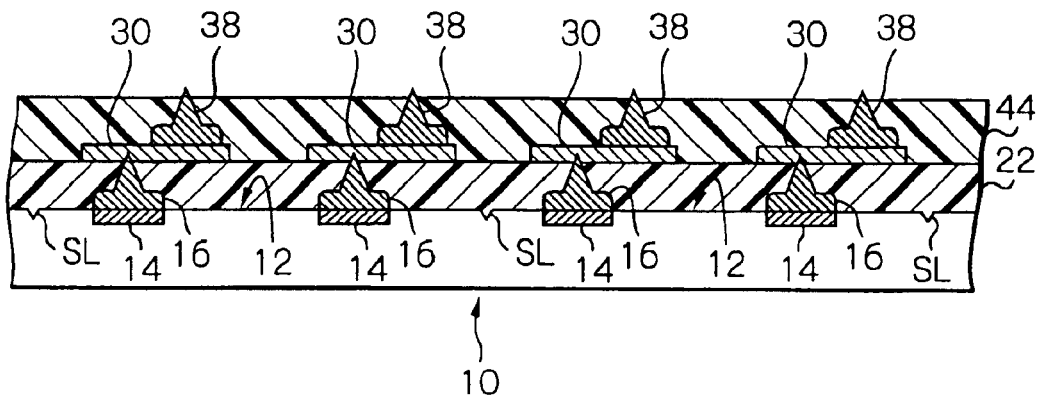

After the resin-sealing layer 44 of the second adhesive resin layer 40 is sufficiently solidified, the film-like support element 42 is peeled and removed from the resin-sealing layer 44 such that the resin-sealing layer 44 is left on the aforesaid first wiring-arrangement, as shown in FIG. 3C. In other words, the resin-sealing layer 44 is transferred from the second adhesive resin sheet 40 to the surface of the aforesaid first wiring-arrangement. As stated above, since the resin-sealing layer 44 has a thickness less than the total dimension of the thickness of the conducting paths 30 plus the entire height of the second sprout-shaped metal bumps 38, the tip ends of the second sprout-shaped metal bumps 38 are projected from the top surface of the resin-sealing layer 44 so as to be exposed to the outside, as shown in FIG. 3C.

Figure 3D:
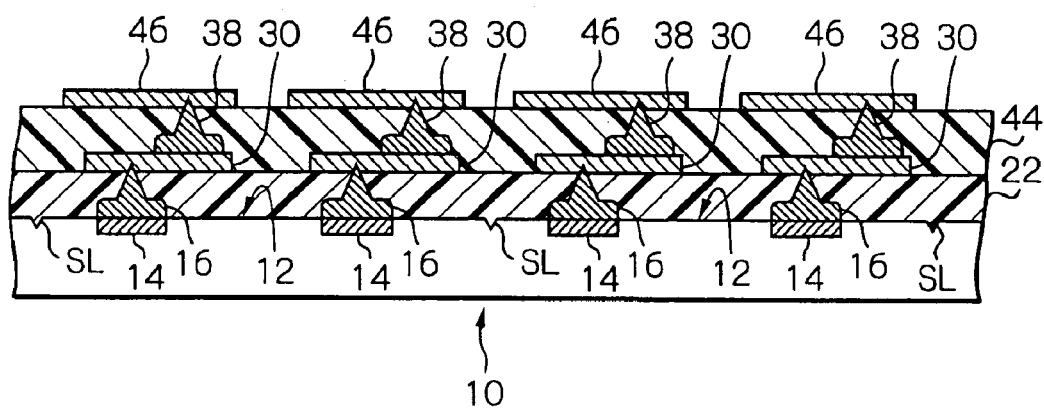

After the removal of the film-like support element 42 from the resin-sealing layer 44, a plurality of second conducting paths 46 are formed on the top surface of the resin-sealing layer 44 such that the respective second conducting paths 46 are connected to the tips of the second sprout-shaped metal bumps 38 projected from the top surface of the resin-sealing layer 44, as shown in FIG. 3D. The second conducting paths 46 define a plurality of wiring patterns formed on the top surface of the resin-sealing layer 44, such that each of the wiring patterns is allocated to a corresponding semiconductor device 12 formed on the silicon wafer 10.

The formation of the second conducting paths 46 may be carried out in substantially the same manner as the aforesaid first conducting paths 30 (FIGS. 2F to 2I). Note, similar to the formation of the aforesaid first conducting paths 30, although a thin metal film is formed on the top surface of the resin-sealing layer 44 prior to the formation of the second conducting paths 46, each of the remaining portions of the thin metal film, which are covered by the respective second conducting paths 46, is illustrated as an integrated part of the conducting path 46 concerned.

Figure 3E:
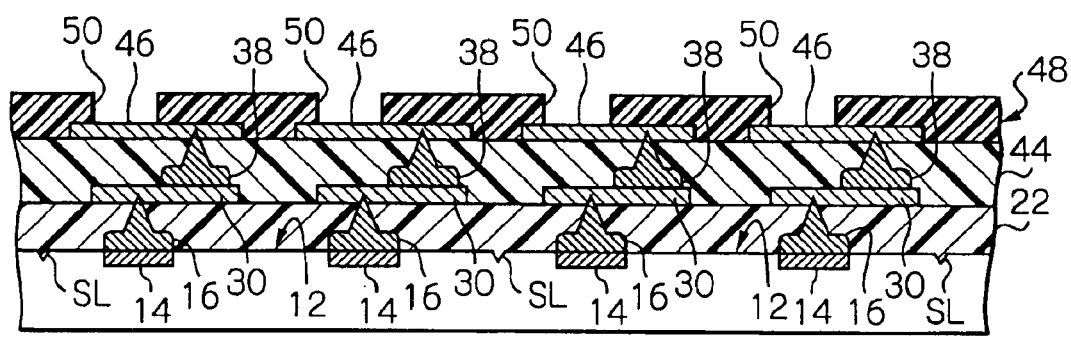

Thereafter, a solder-resist layer 48 is formed on the surface of the resin-sealing layer 44 on which the second conducting paths 46 are arranged, and is patterned by using a photolithography process and an etching process such that a plurality of openings 50 are formed in the solder-resist layer 48, as shown in FIG. 3E. Namely, the formation of the openings 50 is carried out such that each of the openings 50 exposes a local area of a corresponding second conducting path 46. Similar to the aforesaid solder-resist layer 32, the solder-resist layer 48 may be composed of a suitable resin material, such as epoxy, polyimide or the like.

Figure 3F:
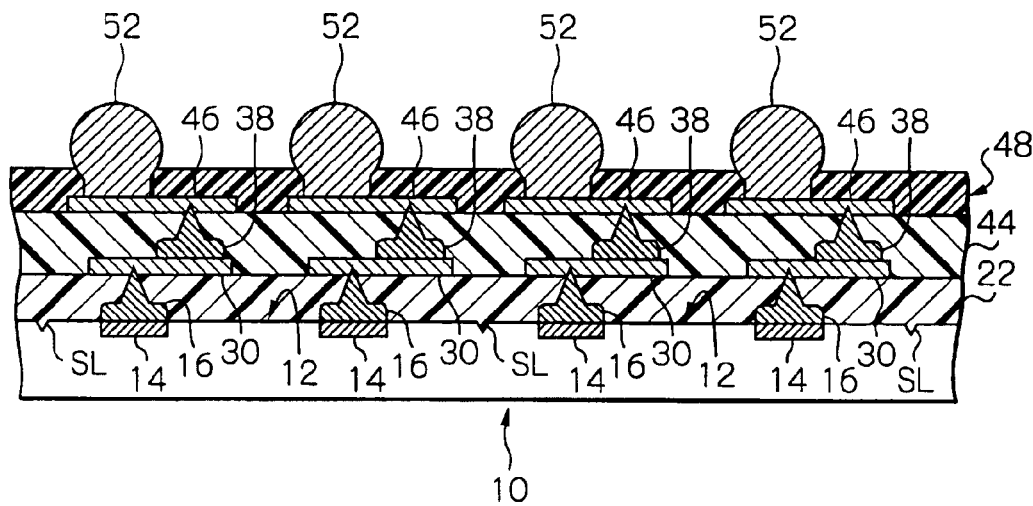

Subsequently, a suitable amount of flux is applied to each of the local areas of the conducting paths 46 defined by the openings 50, and then a plurality of metal balls 52 are soldered and bonded on the second conducting paths 46, as shown in FIG. 3F. Note, similar to the aforesaid metal balls 36, the metal balls 52 may be made of a suitable metal material, such as solder, tin, silver, copper or the like.

Thus, each of the semiconductor chip areas or semiconductor devices 12 is produced as a resin-sealed chip-size package (CSP) on the silicon wafer 10.

In FIG. 3F, of course, the first sprout-shaped metal bumps 16, the first resin-sealing layer 22, and the first conducting paths 30 define the first wiring-arrangement formed on the silicon wafer 10, and the first wiring-arrangement includes a plurality of wiring-board sections, each of which is allocated to a corresponding semiconductor device 12 formed on the silicon wafer 10. Similarly, the second sprout-shaped metal bumps 38, the second resin-sealing layer 44, and the second conducting paths 46 define the second wiring-arrangement formed on the first wiring-arrangement, and the second wiring-arrangement includes a plurality of wiring-board sections, each of which is allocated to a corresponding semiconductor device 12 formed on the silicon wafer 10.

In short, a set of two corresponding wiring-board sections included in the first and second wiring-arrangements serves as a package board or interposer for a corresponding resin-sealed chip-size package (CSP). In this case, each of the sprout-shaped metal bumps 16 functions as a through hole or via hole such that an electrical connection is established between a corresponding electrode pad 14 and a corresponding conducting path 30, and each of the sprout-shaped metal bumps 46 functions as a through hole or via hole such that an electrical connection is established between a corresponding conducting path 30 and a corresponding conducting path 46.

Thereafter, the silicon wafer 10 is subjected to a dicing process in which the silicon wafer 10 is cut along the grid-like grooves SL to thereby separate the resin-sealed chip-size packages from each other.

Figure 3G:
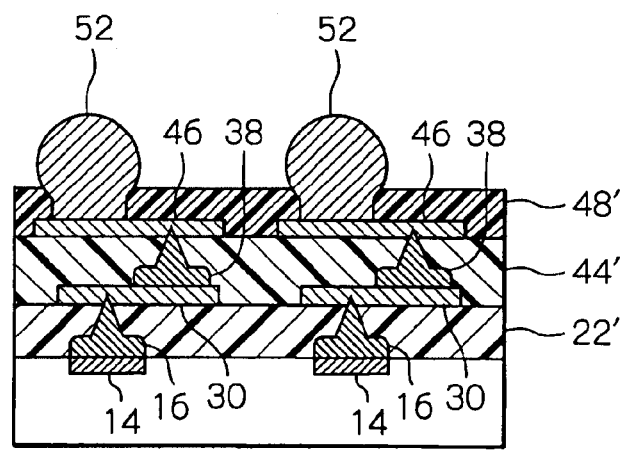
FIG. 3G is a partial cross-sectional view of a representative of the resin-sealed chip-size packages produced in accordance with the first modification of the first embodiment of the production method according to the present invention.

With reference to FIG. 3G, one of the separated resin-sealed chip-size packages is representatively illustrated. As is apparent from this drawing, the wiring-board section including the separated section 22' of the first resin-sealing layer 22, the separate section 44' of the second resin-sealing layer 44, and the separated section 48' of the solder-resist layer 48 has substantially the same size or extent as the semiconductor device 12 cut and separated from the silicon wafer.

Note, similar to the resin-sealed chip-size package shown in FIG. 2L, although only the two metal balls 52 are conceptually illustrated by way of example in the cross-sectional view of FIG. 3G, in reality, a plurality of metal balls are arranged on the wiring pattern including the second conducting paths 46.

Figure 3H:
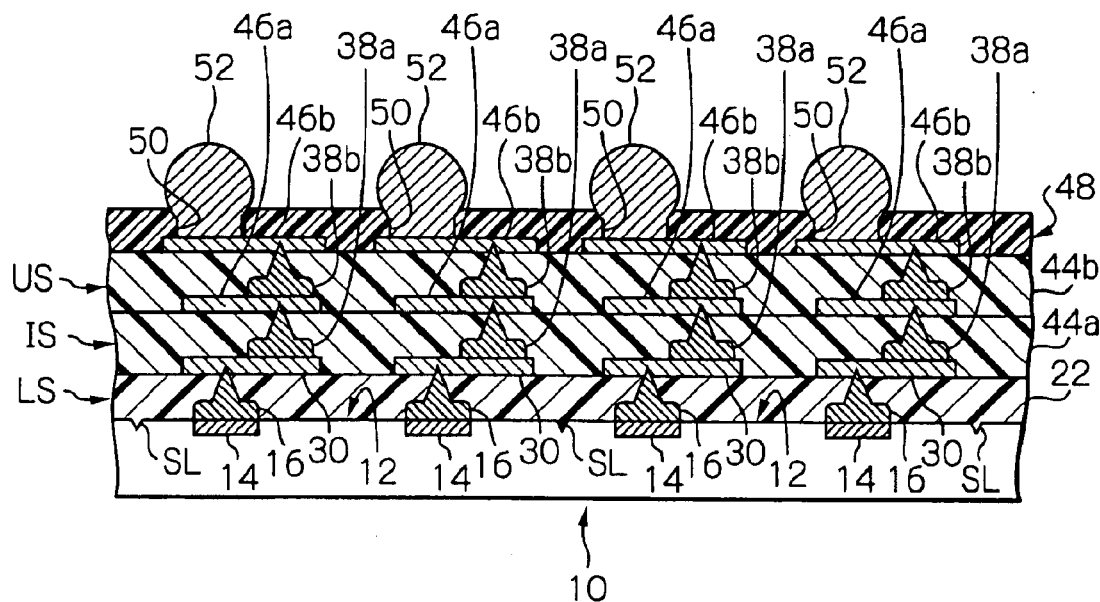
FIG. 3H is a partial cross-sectional view of the silicon wafer, showing a second modification of the first embodiment of the production method according to the present invention

FIG. 3H shows another modification of the aforesaid first embodiment, in which a multi-layered wiring-arrangement is formed on the silicon wafer 10 in replace of both the aforesaid first and second wiring-arrangements. Note, in FIG. 3H corresponding to FIG. 3F, the features similar to those of FIG. 3F are indicated by the same references.

As illustrated, the multi-layered wiring-arrangement includes a lowermost wiring-arrangement section LS securely mounted on the silicon wafer 10, an uppermost wiring-arrangement section US, and at least one intermediate wiring-arrangement section IS intervening therebetween.

The lowermost wiring-arrangement section LS is substantially identical to the aforesaid first wiring arrangement formed on the silicon wafer 10 and defined by the first sprout-shaped metal bumps 16, the first resin-sealing layer 22, and the first wiring pattern including the conducting paths 30.

The intermediate wiring-arrangement section IS is formed on the lowermost wiring-arrangement section LS in substantially the same manner as the aforesaid first and second wiring-arrangements. Namely, the intermediate wiring-arrangement section IS is defined by a plurality of sprout-shaped metal bumps 38a bonded on the conducting paths 30, a resin-sealing layer 44a laminated on the lowermost wiring-arrangement section LS, and a wiring pattern formed on the resin-sealing layer 44a and including a plurality of conducting paths 46a.

The uppermost wiring-arrangement section US is formed on the intermediate wiring-arrangement section IS in substantially the same manner as the aforesaid first and second wiring-arrangements. Namely, the uppermost wiring-arrangement section US is defined by a plurality of sprout-shaped metal bumps 38b bonded on the conducting paths 38a, a resin-sealing layer 44b laminated on the intermediate wiring-arrangement section IS, and a wiring pattern formed on the resin-sealing layer 44b and including a plurality of conducting paths 46b.

After the formation of the multi-layered wiring-arrangement, a solder-resist layer 48 is formed on the surface of the resin-sealing layer 44b on which the conducting paths 46b are arranged, and is patterned by using a photolithography process and an etching process such that a plurality of openings 50 are formed in the solder-resist layer 48. Namely, the formation of the openings 50 is carried out such that each of the openings 50 exposes a local area of a corresponding second conducting path 46b.

Subsequently, a suitable amount of flux is applied to each of the local areas of the conducting paths 46b defined by the openings 50, and then a plurality of metal balls 52 are soldered and bonded on the conducting paths 46b, as shown in FIG. 3H.

Thus, each of the semiconductor chip areas or semiconductor devices 12 is produced as a resin-sealed chip-size package (CSP) on the silicon wafer 10.

Similar to the above-mentioned embodiments, the multi-layer wiring-arrangement includes a plurality of wiring-board sections, each of which is allocated to a corresponding semiconductor device 12 formed on the silicon wafer 10, and each of the wiring-board section serves as a package board or interposer for a corresponding resin-sealed chip-size package (CSP).

Thereafter, the silicon wafer 10 is subjected to a dicing process in which the silicon wafer 10 is cut along the grid-like grooves SL to thereby separate the resin-sealed chip-size packages from each other.

Figure 3I:
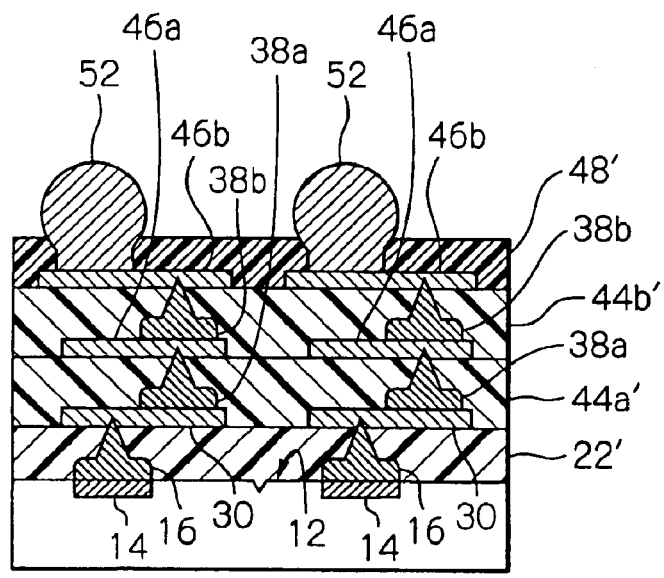
FIG. 3I is a partial cross-sectional view of a representative of the resin-sealed chip-size packages produced in accordance with the second modification of the first embodiment of the production method according to the present invention.

With reference to FIG. 3I, one of the separated resin-sealed chip-size packages is representatively illustrated. As is apparent from this drawing, the wiring-board section, including the separated section 22' of the resin-sealing layer 22, the separate section 44a' of the resin-sealing layer 44a, the separated section 44b', and the separated section 48' of the solder-resist layer 48, has substantially the same size or extent as the semiconductor device 12 cut and separated from the silicon wafer 10.

Note, similar to the resin-sealed chip-size package shown in FIGS. 2L and 3G, although only the two metal balls 52 are conceptually illustrated by way of example in the cross-sectional view of FIG. 3I, in reality, a plurality of metal balls are arranged on the wiring pattern including the conducting paths 46b.

FIGS. 5A to 5E show representative steps of a modification of the aforesaid first embodiment of the production method according to the present invention. Note, in FIGS. 5A to 5E, the features similar to those of FIGS. 2A to 2D are indicated by the same references.

Figure 4A:
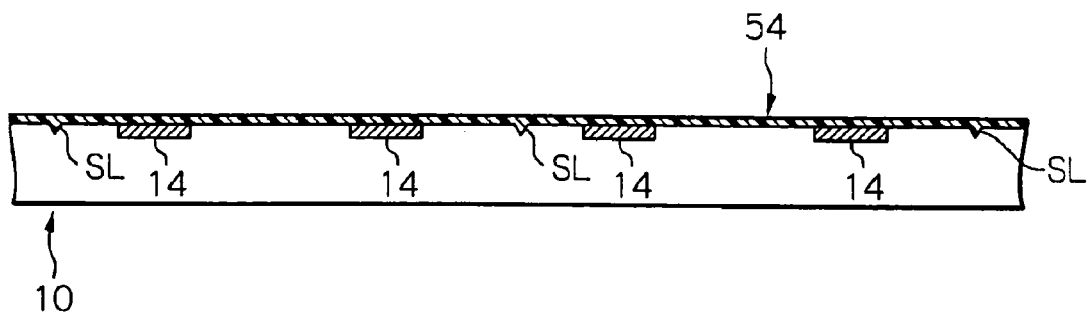
FIGS. 4A to 4C are respective partial cross-sectional views of a silicon wafer, which show representative steps of a first modification of the aforesaid first embodiment of the production method according to the present invention.
Figure 4B:
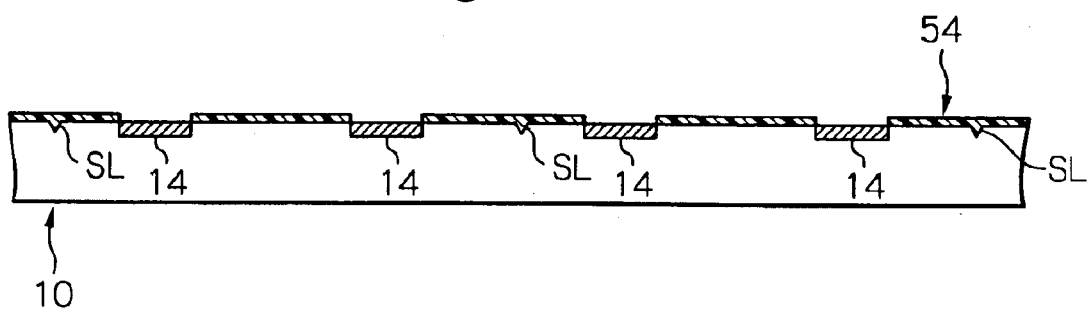
Figure 4C:
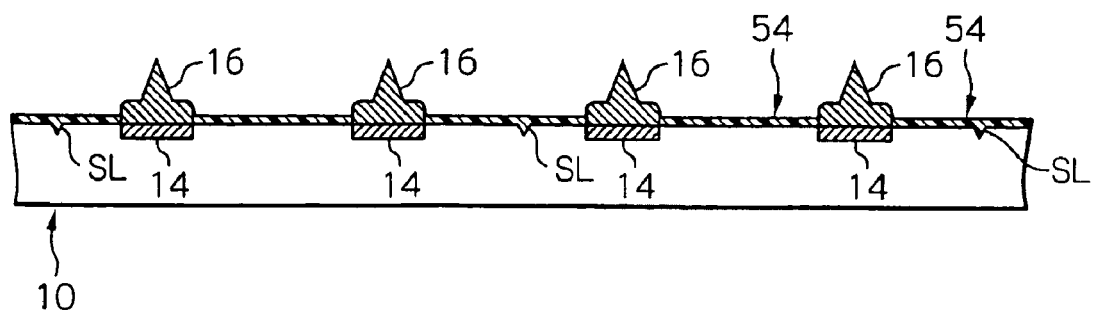

In this modified embodiment, as shown in FIG. 4A, a thin resin layer 54, which may be composed of a suitable resin material, such as polyimide, is formed on the top surface of the silicon wafer 10 on which the plurality of electrode pads 14 are formed and arranged. Then, the thin resin layer 54 is patterned by using by using a photolithography process and an etching process such that the electrode pads 14 are exposed to the outside, as shown in FIG. 4B, and the plurality of sprout-shaped metal bumps 16 are bonded on the exposed electrode pads 14, as shown in FIG. 4C.

Figure 4D:
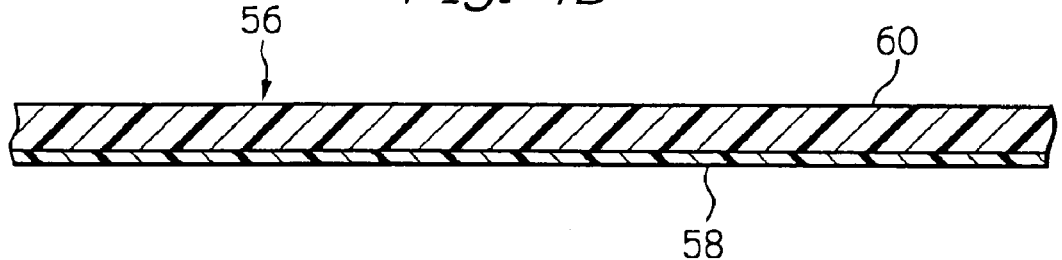
FIG. 4D is a partial cross-sectional view of an adhesive resin sheet to be prepared at a stage corresponding to the stage (B) shown in FIG. 1, showing another representative step of the modification of first embodiment of the production method according to the present invention.

In this modified embodiment, as shown in FIG. 4D, an adhesive resin sheet 56, which may be produced in substantially the same manner as the adhesive resin sheet 18, is prepared. Namely, similar to the adhesive resin sheet 18, the adhesive resin sheet 56 is constituted from a film-like support element 58, and a resin-sealing layer 60 formed on the film-like support element 20, but the resin-sealing layer 60 has a thickness less than the resin-sealing layer 22 of the adhesive resin sheet 18 by a thickness of the thin resin film 54.

Figure 4E:
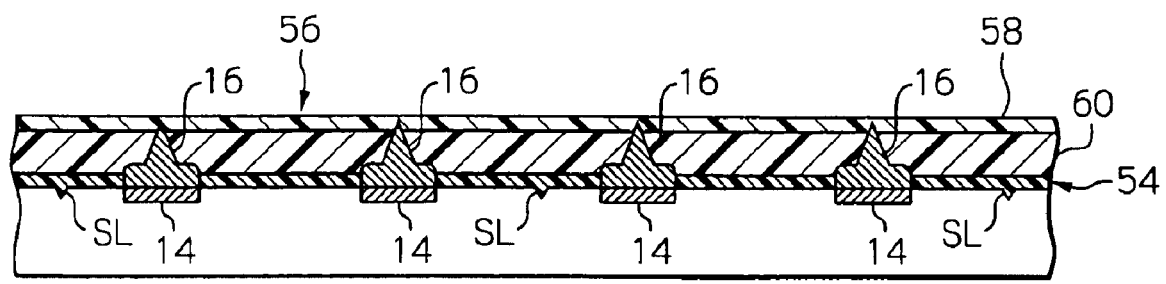
FIG. 4E is a respective partial cross-sectional view of the silicon wafer, corresponding to FIG. 2D, which shows yet another representative step of the modification of the first embodiment of the production method according to the present invention.

Thus, when the adhesive resin sheet 56 is laminated on the surface of the silicon wafer 10 having the sprout-shaped metal bumps 16 and the patterned thin resin film 54 provided thereon, the penetration of the sprout-shaped metal bumps 16 through the resin-sealing layer 60 of the adhesive resin sheet 56 is ensured, as shown in FIG. 4E. Thereafter, the silicon wafer 10 having the laminated adhesive resin sheet 56 is processed in accordance with the steps as shown in FIGS. 2E to 2K, resulting in production of the resin-sealed chip-size packages (FIG. 2L).

This modified embodiment is very advantageous when the sealing-resin layer 60 of the adhesive resin sheet 56 exhibits an inferior adhesive property to the surface of the silicon wafer 10. Namely, it is possible to improve the adhesive property of the sealing-resin layer 60 to the silicon wafer 10 due to the existence of the thin resin film 54 intervened therebetween.

Figure 5A:
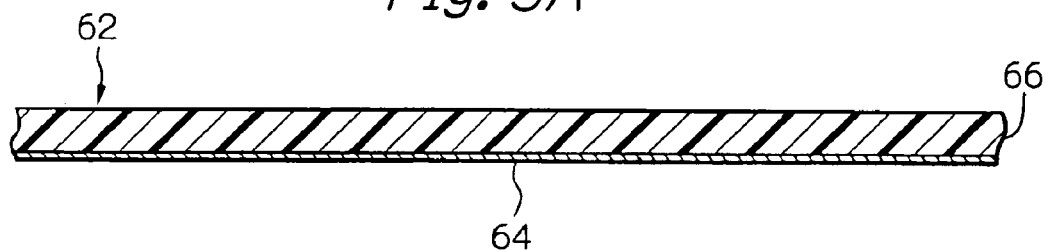
FIG. 5A is a partial cross-sectional view of an adhesive resin sheet to be prepared at a stage corresponding to the stage (B) shown in FIG. 1, which shows a representative step of a second embodiment of a manufacturing method for manufacturing a plurality of chip-size packages from a silicon wafer according to the present invention.
Figure 5B:
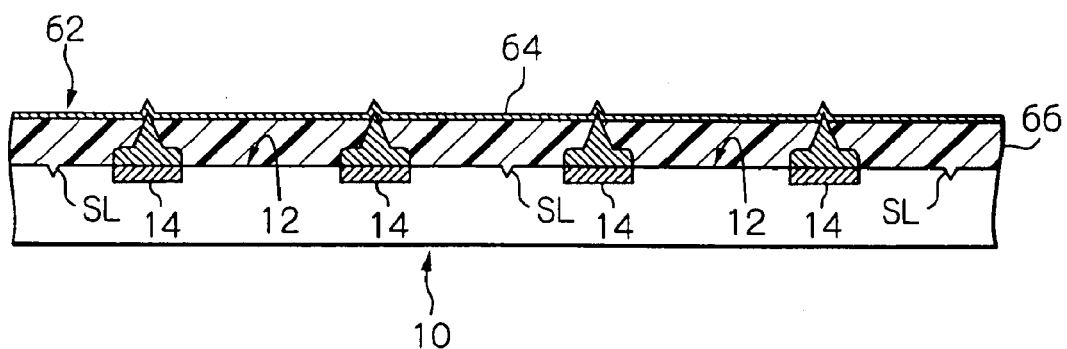
FIG. 5B is a partial cross-sectional view of the silicon wafer, which shows another representative step of the second embodiment of the production method according to the present invention.

With reference to FIGS. 5A and 5B, a second embodiment of the production method for manufacturing a plurality of chip-size packages according to the present invention is partially illustrated. FIGS. 5A and 5B show two respective steps corresponding to the steps shown in FIGS. 2C and 2D. In FIGS. 5A and 5B, the features similar to those of FIGS. 2C and 2D are indicated by the same references.

Similar to the first embodiment, in the second embodiment, as shown in FIG. 5B, a plurality of semiconductor chip areas 12 are defined by grid-like fine grooves SL on a surface of a silicon wafer 10, and the silicon wafer 10 is processed by various well-known methods such that each of the semiconductor chip areas 12 is produced as a semiconductor device. Also, each of the semiconductor chip areas or semiconductor devices 12 has a plurality of electrode pads 14 formed thereon, and a plurality of sprout-shaped metal bumps 16 bonded on the respective electrode pads 14. Of course, it is possible to form the sprout-shaped metal bumps 16 in substantially the same manner as mentioned above, using the aforesaid well-known wire-bonding machine.

In the step shown in FIG. 5A, corresponding to FIG. 2C, an adhesive resin sheet 62, having substantially the same diameter as the silicon wafer 10, is prepared. As shown in FIG. 5A, the adhesive resin sheet 62 is constituted from a metal film 64, and a resin-sealing layer 66 formed on the metal film 64 and having a thickness less than the entire height of the sprout-shaped metal bumps 16.

For example, the metal film 62 may be made of a suitable metal material, such as aluminum, copper or the like. Similar to the aforesaid resin-sealing layer 22 in the first embodiment, the resin-sealing layer 66 may be composed of either a thermoplastic resin material, such as polyimide, or a thermosetting resin material, such as epoxy. Also, the resin-sealing layer 66 may be composed of a hybrid resin material which is composed of a suitable thermoplastic resin component, such as polyimide or the like, and a suitable thermosetting resin component, such as epoxy or the like. In all cases, the adhesive resin sheet 62 may be produced by coating a surface of the metal film 64 with a solution which is composed of a suitable resin component and a suitable solvent component.

After the production of the adhesive resin sheet 62, it is subjected to an evaporation process in which the solvent component is partially evaporated from the resin-sealing layer 66 such that the resin-sealing layer 66 is put in a moderate gel state. Then, the adhesive resin sheet 62 is placed on the silicon wafer 10 such that the surface of the resin-sealing layer 66 is opposed to the arrangement of sprout-shaped metal bumps 16 on the silicon wafer 10. Subsequently, the silicon wafer 10 carrying the adhesive resin sheet 62 placed thereon is subjected to a laminating process by a vacuum laminating machine, a high-pressure press machine, a vacuum press machine and so on, which are well known in this field. Thus, the adhesive resin sheet 62 is pressed against the silicon wafer 10 such that the sprout-shaped metal bumps 16 are penetrated through the resin-sealing layer 66 of the adhesive resin sheet 62 due to the moderate gel state of the resin-sealing layer 66, and such that the tips of the sprout-shaped metal bumps 16 are abutted against the metal film 64, resulting in formation of dents in the metal film 64 by the tips of the sprout-shaped metal bumps 16, as shown in FIG. 5B.

After the laminating process is completed, the silicon wafer 10 having the laminated adhesive resin sheet 62 is taken out of the vacuum laminating machine, and is processed such that the resin-sealing layer 66 is sufficiently solidified. Thereafter, the silicon wafer 10 having the laminated adhesive resin sheet 62 is processed in accordance with the steps as shown in FIGS. 2G to 2K, resulting in production of the resin-sealed chip-size packages (FIG. 2L).

According to the second embodiment, since the metal film 64 of the laminated adhesive resin sheet 62 functions as the thin metal film 24 of the aforesaid first embodiment shown in FIG. 2F, the formation step of the thin metal film 24 is unnecessary in this second embodiment. Thus, it is possible to more efficiently produce the resin-sealed chip-size packages with in comparison with the first embodiment.

In the above-mentioned embodiments, since there is an inevitable difference between a linear thermal expansion coefficient of the resin-sealing layer (22, 44, 60, 66) and linear thermal expansion coefficients of both the silicon wafer 10 and the sprout-shaped metal bumps (16, 38), a thermal stress is produced in the resin sealing-layer (22, 44,

60, 66). Of course, when the thermal stress is too large, the chip-size packages may be prematurely subjected to damage. Therefore, the linear thermal expansion coefficient of the resin-sealing layer (22, 44, 60, 66) should be selected such that the thermal stress is reduced as small as possible, so that the premature damage of the chip-size packages can be prevented.

It is commendable that the selection of the linear thermal expansion coefficient of the resin-sealing layer (22, 44, 60, 66) is performed such that it falls in a range between the linear thermal expansion coefficients of both the silicon wafer 10 and the linear thermal expansion coefficient of the sprout-shaped metal bumps (16, 38). For example, when the silicon wafer 10 has the linear thermal expansion coefficient of 3 ppm/° C., and when the metal bumps (16, 38) has the linear thermal expansion coefficient of 15 ppm/° C. the linear thermal expansion coefficient of the resin-sealing layer (22, 44, 60, 66) should be selected from the range between 3 ppm/° C. and 15 ppm/° C.

On the other hand, the resin-sealing layer (22, 44, 60, 66) itself has a function of mitigating a strain resulting from the thermal stress, because it exhibits a certain degree of elasticity. Thus, the thicker a thickness of the resin-sealing layer, the larger an effect of the strain-mitigating function. For this reason, preferably, the resin-sealing layer should has a thickness of at least 50 μm. More preferably, the thickness of the resin-sealing layer should be more than 100 μm.

As is apparent from the foregoing, the entire height of the sprout-shaped metal bumps (16, 38) must be always larger than the thickness of the resin-sealing layer (22, 44, 60, 66), before the tips of the sprout-shaped metal bumps can be projected from the top surface of the resin-sealing layer.

By using the aforesaid gold wire having the diameter of 25 μm, it is difficult or impossible to produce a sprout-shaped metal bump having an entire height of more than 100 μm. For example, a gold wire having a diameter of 50 μm must be used, before it is possible to produce the sprout-shaped metal bump having the entire height of more than 100 μm. However, the sprout-shaped metal bump having the entire height of more than 100 μm bears a base portion having a diameter of more than 100 μm. Thus, these large metal bumps can be incorporated in only a chip-size package which includes a plurality of electrode pads having a dimension of more than 100 μm. Namely, this means that a setting of more than 100 μm cannot be given to a thickness of the resin-sealing layer in a chip-size package including a plurality of electrode pads having a dimension of, for example, 60 μm.

Figure 6:
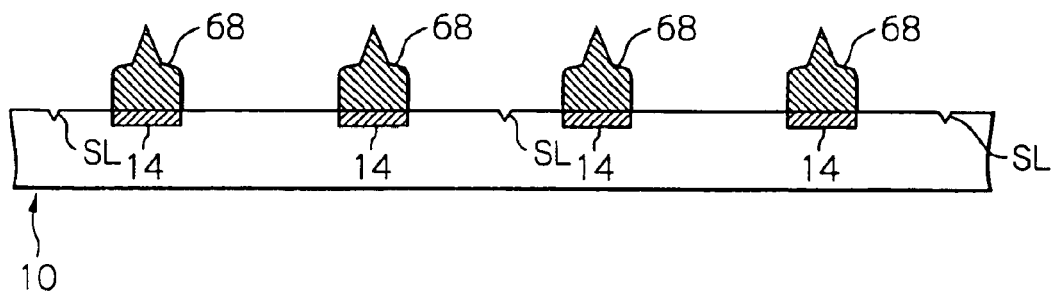
FIG. 6 shows a partial cross-sectional view of a silicon wafer, similar to FIG. 2B, showing sprout-shaped metal bumps, each of which is formed by stacking up the two metal bumps.

Nevertheless, as shown in FIG. 6 corresponding to FIG. 2B, by stacking up at least two metal bumps obtained from the aforesaid gold wire having the diameter of 25 μm, it is possible to give the setting of more than 100 μm to the thickness resin-sealing layer in the chip-size package which includes the electrode pads having the dimension of 60 μm.

In particular, in FIG. 6, each reference 68 indicates a sprout-shaped metal bump having an entire height of more than 100 μm, and this sprout-shaped metal bumps is formed by stacking up the two metal bumps obtained from the gold wire having the diameter of 25 μm. Namely, the plurality of sprout-shaped bumps 16 are once produced from the gold wire having the diameter of 25 μm, using the wire-bonding machine (FIG. 2B), and then a plurality of sprout-shaped bumps are further produced from the gold wire having the diameter of 25 μm such that a further produced metal bump is placed on and pressed against a corresponding metal bump 16, resulting in the production of the sprout-shaped metal bumps 68 having the entire height of more than 100 μm, as shown in FIG. 6. In short, it is possible to give the setting of more than 100 μm to the thickness of the resin-sealing layer in the chip-size package including the electrode pads having the dimension of 60 μm.

In the above-mentioned embodiments, although the adhesive resin sheet (18, 56, 62) has the circular shape having substantially the same diameter as the silicon wafer 10, it may be formed into another shape, such as a rectangular shape, which has a sufficient extent so that the silicon wafer 10 is completely covered with the rectangular adhesive resin sheet.

In this case, after the rectangular adhesive resin sheet is laminated on the silicon wafer 10, it is necessary cut the rectangular adhesive sheet along the circular edge of the silicon wafer 10.

Also, in the above-mentioned embodiments, when the resin-sealed chip-size package is mounted on a motherboard, each of the metal balls (36, 52) is used as an outer electrode terminal to be electrically connected to a corresponding electrode pad formed on the motherboard, but each of the outer electrode terminals may be not necessarily formed as the ball shape. For example, each of the outer electrode terminals may be formed as a stub-shaped element.

In accordance with the above-mentioned production method of the present invention, it is possible to manufacture a resin-sealed chip-size package comprising a semiconductor device having a plurality of electrode pads formed thereon, a plurality of sprout-shaped metal bumps bonded on the electrode pads, respectively, a resin-sealing layer laminated on the semiconductor device such that tips of the sprout-shaped metal bumps are projected from a top surface of the resin-sealing layer, a wiring pattern formed on the top surface of the resin-sealing layer so as to be in electrical contact with the tips of the sprout-shaped metal bumps, and a plurality of outer electrode terminals formed on the wiring-pattern such that electrical connections are established therebetween.

Also, in accordance with the above-mentioned production method of the present invention, it is possible to manufacture a resin-sealed chip-size package comprising a semiconductor device having a plurality of electrode pads formed thereon, a plurality of first sprout-shaped metal bumps bonded on the electrode pads, respectively, a first resin-sealing layer laminated on the semiconductor device such that tips of the first sprout-shaped metal bumps are projected from a top surface of the first resin-sealing layer, a first wiring pattern formed on the top surface of the first resin-sealing layer so as to be in electrical contact with the tips of the first sprout-shaped metal bumps, a plurality of second sprout-shaped metal bumps bonded on the first wiring pattern, a second resin-sealing layer laminated on the first resin-sealing layer such that tips of the second sprout-shaped metal bumps are projected from a top surface of the second resin-sealing layer, a second wiring pattern formed on the top surface of the second resin-sealing layer so as to be in electrical contact with the tips of the second sprout-shaped metal bumps, and a plurality of outer electrode terminals formed on the second wiring-pattern such that electrical connections are established therebetween.

Further, in accordance with the above-mentioned production method of the present invention, it is possible to manufacture a resin-sealed chip-size package comprising a multi-layered wiring-arrangement formed on the semiconductor device, and the multi-layered wiring-arrangement includes a lowermost wiring-arrangement section securely mounted on the semiconductor device, an uppermost wiring-arrangement section, and at least one intermediate wiring-arrangement section intervening therebetween. Each of the wiring-arrangement sections includes a resin-sealing layer, a plurality of wiring patterns formed on a top surface of the resin-sealing layer, and a plurality of sprout-shaped metal bumps penetrated into the resin-sealing layer such that tips of the sprout-shaped metal bumps are projected from the top surface of the resin-sealing layer. The plurality of sprout-shaped bumps of the lowermost wiring-arrangement section establish electrical connections between the electrode pads formed on each of the semiconductor devices and the wiring pattern of the lowermost wiring-arrangement section, and the plurality of sprout-shaped bumps of each of the remaining wiring-arrangement sections except for the lowermost wiring-arrangement section establish electrical connections between the wiring pattern of the directly-under wiring-arrangement section and the wiring pattern of the wiring-arrangement section concerned. The resin-sealed chip-size package further comprises a plurality of outer electrode terminals formed on the wiring pattern formed on the uppermost wiring-arrangement such that electrical connections are established therebetween.

Finally, it will be understood by those skilled in the art that the foregoing description is of preferred embodiments of the methods, and that various changes and modifications may be made to the present invention without departing from the spirit and scope thereof.

What is claimed is:

1. A production method for manufacturing a plurality of chip-size packages, which comprises:
    defining a plurality of semiconductor chip areas on a surface of a wafer, with each of said semiconductor chip areas being produced as a semiconductor device having a plurality of electrode pads formed thereon;
    forming a plurality of sprout-shaped metal bumps on each of said semiconductor devices such that said respective sprout-shaped metal bumps are bonded on said electrode pads formed on a corresponding semiconductor device;
    forming a resin-sealing layer on the surface of said wafer such that tips of said sprout-shaped metal bumps formed on each of said semiconductor devices are projected from a top surface of said resin-sealing layer;
    forming a plurality of wiring patterns on the top surface of said resin-sealing layer such that each of said wiring patterns is allocated to a corresponding semiconductor device, and such that electrical connections are established between each of said wiring patterns and the tips of said sprout-shaped metal bumps formed on the corresponding semiconductor device; and
    forming a plurality of outer electrode terminals on each of said wiring patterns such that electrical connections are established therebetween, whereby each of said semiconductor devices is produced as a resin-sealed chip-size package on said wafer.

2. A production method as set forth in claim 1, further comprising dicing said wafer such that said resin-sealed chip-size packages are individually separated therefrom.

3. A production method as set forth in claim 1, wherein each of said wiring patterns includes a plurality of conducting paths, and each of said outer electrode terminals is configured as a metal ball, with the metal ball being soldered and bonded on one of said conducting paths.

4. A production method as set forth in claim 3, wherein a solder resist layer is formed on the top surface of said resin-sealing layer after the forming of said metal balls, and is patterned such that a plurality of openings are formed to solder and bond said respective metal balls to said conducting paths though the openings formed in said solder resist layer.

5. A production method as set forth in claim 1, wherein, in the forming of said sprout-shaped metal bumps, each of said sprout-shaped metal bumps is produced from a metal wire, using a wire-bonding machine, and each of said sprout-shaped metal bumps has a base portion bonded on a corresponding electrode pad, and a cone-like portion integrally protruded from said base portion.

6. A production method as set forth in claim 5, wherein the production of each of said sprout-shaped metal bumps is carried out by stacking up at least two metal bumps, obtained from said metal wire, using said wire-bonding machine.

7. A production method as set forth in claim 1, wherein the forming of said resin-sealing layer comprises:
    preparing an adhesive resin sheet including a film-like support element carrying said sealing-resin layer formed thereon;
    laminating said adhesive resin sheet on said wafer such that said sprout-shaped metal bumps are penetrated into the resin-sealing layer of said adhesive resin sheet; and
    removing said film-like support element from said adhesive resin sheet, with a thickness of said resin-sealing layer being smaller than an entire height of said sprout-shaped metal bumps, resulting in the projection of the tips of said sprout-shaped metal bumps from the top surface of said resin-sealing layer.

8. A production method as set forth in claim 7, wherein the forming of said wiring patterns comprises:
    forming of a thin metal film on the top surface of said resin-sealing layer;
    patterning said thin metal film such that a plurality of film-like metal patterns corresponding to said wiring patterns are formed therein; and
    thickening said thin metal film patterns such that said film-like metal patterns grow into said wiring patterns.

9. A production method as set forth in claim 8, wherein the forming of said thin metal film is carried out by using a thin metal film formation process selected from the group consisting of a sputtering process, an electroless plating process, and a vacuum metal deposition process, and the thickening of said thin metal film patterns is carried out by using an electroplating process.

10. A production method as set forth in claim 1, wherein the forming of said resin-sealing layer comprises:
    preparing an adhesive resin sheet including a film-like metal support element carrying said sealing-resin layer formed thereon; and
    laminating said adhesive resin sheet on said wafer such that said sprout-shaped metal bumps are penetrated into the resin-sealing layer of said adhesive resin sheet, with a thickness of said resin-sealing layer being smaller than an entire height of said sprout-shaped metal bumps, resulting in the projection of the tips of said sprout-shaped metal bumps from the top surface of said resin-sealing layer, whereby the tips of said sprout-shaped metal bumps are in electrical contact with said film-like metal support element.

11. A production method as set forth in claim 10, wherein the forming of said wiring patterns comprises:
    patterning said film-like metal support element such that a plurality of film-like metal patterns corresponding to said wiring patterns are formed therein; and thickening said film-like metal patterns such that said film-like metal patterns grow into said wiring patterns.

12. A production method as set forth in claim 11, wherein the thickening of said thin metal film patterns is carried out by using an electroplating process.

13. A production method as set forth in claim 1, wherein said resin-sealing layer has a thickness of at least 50 µm.

14. A production method for manufacturing a plurality of chip-size packages, which comprises:

defining a plurality of semiconductor chip areas on a surface of a wafer, with each of said semiconductor chip areas being produced as a semiconductor device having a plurality of electrode pads formed thereon;

forming a first wiring-arrangement on the surface of said wafer, said first wiring-arrangement including
a plurality of first sprout-shaped metal bumps formed on each of said semiconductor devices, such that said respective sprout-shaped metal bumps are bonded on said electrode pads formed on a corresponding semiconductor device,
a first resin-sealing layer formed on the surface of said wafer such that tips of said sprout-shaped metal bumps formed on each of said semiconductor devices are projected from a top surface of said resin-sealing layer, and
a plurality of first wiring patterns formed on the top surface of said first resin-sealing layer such that each of said first wiring patterns is allocated to a corresponding semiconductor device, and such that electrical connections are established between each of said first wiring patterns and the tips of said first sprout-shaped metal bumps formed on the corresponding semiconductor device;

forming a second wiring-arrangement on said first wiring-arrangement, said second wiring-arrangement including
a plurality of second sprout-shaped metal bumps formed on and bonded on each of said first wiring patterns so as to be allocated to a corresponding semiconductor device,
a second resin-sealing layer formed on the first wiring patterns formed on said first wiring-arrangement, such that tips of said second sprout-shaped metal bumps are projected from a top surface of said second resin-sealing layer, and
a plurality of second wiring patterns formed on the top surface of said second resin-sealing layer such that each of said second wiring patterns is allocated to a corresponding semiconductor device, and such that electrical connections are established between each of said wiring patterns and the tips of said sprout-shaped metal bumps allocated to the corresponding semiconductor device;

forming a plurality of outer electrode terminals on each of said second wiring patterns such that electrical connections are established therebetween, whereby each of said semiconductor devices is produced as a resin-sealed chip-size package on said wafer.

15. A production method as set forth in claim 14, further comprising dicing said wafer such that said resin-sealed chip-size packages are individually separated therefrom.

16. A production method for manufacturing a plurality of chip-size packages, which comprises:

defining a plurality of semiconductor chip areas on a surface of a wafer, with each of said semiconductor chip areas being produced as a semiconductor device having a plurality of electrode pads formed thereon;

forming a multi-layered wiring-arrangement on the surface of said wafer, said multi-layered wiring-arrangement including a lowermost wiring-arrangement section securely mounted on the surface of said wafer, an uppermost wiring-arrangement section, and at least one intermediate wiring-arrangement section intervening therebetween, each of said wiring-arrangement sections including
a resin-sealing layer,
a plurality of wiring patterns formed on a top surface of said resin-sealing layer and allocated to each of said semiconductor devices, and
a plurality of sprout-shaped metal bumps allocated to each of said semiconductor devices and penetrated into said resin-sealing layer such that tips of said sprout-shaped metal bumps are projected from the top surface of said resin-sealing layer, the plurality of sprout-shaped bumps of said lowermost wiring-arrangement section establish electrical connections between the electrode pads formed on each of said semiconductor devices and the corresponding wiring pattern of said lowermost wiring-arrangement section, the plurality of sprout-shaped bumps of each of the remaining wiring-arrangement sections except for said lowermost wiring-arrangement section establish electrical connections between the corresponding wiring pattern of the directly-under wiring-arrangement section and the corresponding wiring pattern of said wiring-arrangement section concerned; and forming a plurality of outer electrode terminals on each of the wiring patterns formed on said uppermost wiring-arrangement such that electrical connections are established therebetween, whereby each of said semiconductor devices is produced as a resin-sealed chip-size package on said wafer.

17. A production method as set forth in claim 16, further comprising dicing said wafer such that said resin-sealed chip-size packages are individually separated therefrom.

* * * * *